(12) United States Patent
Afsahi et al.

(10) Patent No.: US 8,737,935 B2
(45) Date of Patent: May 27, 2014

(54) MULTI-BAND UP-CONVERTOR MIXER

(75) Inventors: Ali Afsahi, San Diego, CA (US); Utku Seckin, La Jolla, CA (US)

(73) Assignee: Broadcom Corporation, Irvine, CA (US)

( * ) Notice: Subject to any disclaimer, the term of this patent is extended or adjusted under 35 U.S.C. 154(b) by 61 days.

(21) Appl. No.: 13/534,775

(22) Filed: Jun. 27, 2012

(65) Prior Publication Data

US 2013/0288612 A1 Oct. 31, 2013

Related U.S. Application Data

(60) Provisional application No. 61/640,585, filed on Apr. 30, 2012.

(51) Int. Cl.
*H04B 1/04* (2006.01)

(52) U.S. Cl.
USPC ............................................. 455/103; 455/73

(58) Field of Classification Search
CPC ..... H04B 1/0475; H04B 1/406; H04B 1/0483
USPC ........ 455/102, 118, 127.4, 91, 73, 103, 552.1
See application file for complete search history.

(56) References Cited

U.S. PATENT DOCUMENTS

| | | | | |
|---|---|---|---|---|
| 6,640,091 B1 * | 10/2003 | Shiraishi | ....................... | 455/118 |
| 7,092,676 B2 * | 8/2006 | Abdelgany et al. | ............. | 455/76 |
| 8,340,607 B2 * | 12/2012 | Jerng | ........................... | 455/118 |
| 2013/0244599 A1 * | 9/2013 | Kaukovuori et al. | ......... | 455/102 |

* cited by examiner

*Primary Examiner* — Sonny Trinh
(74) *Attorney, Agent, or Firm* — Garlick & Markison; Randy W. Lacasse

(57) ABSTRACT

A communications transceiver includes a shared multi-band mixer. Various configurations of the shared multi-band mixer include using suitable hardware/software in the form of circuitry, logic gates, and/or code functions to combine multi-band processing of RF signal conversion within a single shared mixer. Various configurations include separate or shared tuning and/or amplification of up-converted (mixed) multi-band communication bands. The communications transceiver processes each band separately within the single shared mixer.

20 Claims, 10 Drawing Sheets

US 8,737,935 B2

MULTI-BAND UP-CONVERTOR MIXER

CROSS REFERENCE TO RELATED PATENTS

The present application claims priority based on 35 USC 119 to the provisionally filed application entitled, COMMUNICATION SYSTEM TRANSCEIVERS, having Ser. No. 61/640,585, filed on Apr. 30, 2012, the contents of which are incorporated herein for any and all purposes, by reference thereto.

BACKGROUND OF THE INVENTION

1. Technical Field of the Invention

This invention relates generally to wireless communication and more particularly to circuits used to support wireless communications.

2. Description of Related Art

Communication systems are known to support wireless and wireline communications between wireless and/or wireline communication devices. Such communication systems range from national and/or international cellular telephone systems to the Internet to point-to-point in-home wireless networks to radio frequency identification (RFID) systems. Each type of communication system is constructed, and hence operates, in accordance with one or more communication standards. For instance, wireless communication systems may operate in accordance with one or more standards including, but not limited to, 3GPP, LTE, LTE Advanced, RFID, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to one or more antennas (e.g., MIMO) and may include one or more low noise amplifiers, one or more intermediate frequency stages, a filtering stage, and a data recovery stage. The low noise amplifier(s) receives inbound RF signals via the antenna and amplifies them. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

Currently, wireless communications occur within licensed or unlicensed frequency spectrums. For example, wireless local area network (WLAN) communications occur within the unlicensed Industrial, Scientific, and Medical (ISM) frequency spectrum of 900 MHz, 2.4 GHz, and 5 GHz. While the ISM frequency spectrum is unlicensed there are restrictions on power, modulation techniques, and antenna gain. Another unlicensed frequency spectrum is the V-band of 55-64 GHz.

Disadvantages of conventional approaches will be evident to one skilled in the art when presented in the disclosure that follows.

BRIEF SUMMARY OF THE INVENTION

The technology described herein is directed to an apparatus and methods of operation that are further described in the following Brief Description of the Drawings and the Detailed Description of the Invention. Other features and advantages will become apparent from the following detailed description made with reference to the accompanying drawings.

BRIEF DESCRIPTION OF THE SEVERAL VIEWS OF THE DRAWING(S)

DETAILED DESCRIPTION OF THE INVENTION

Figure 1:
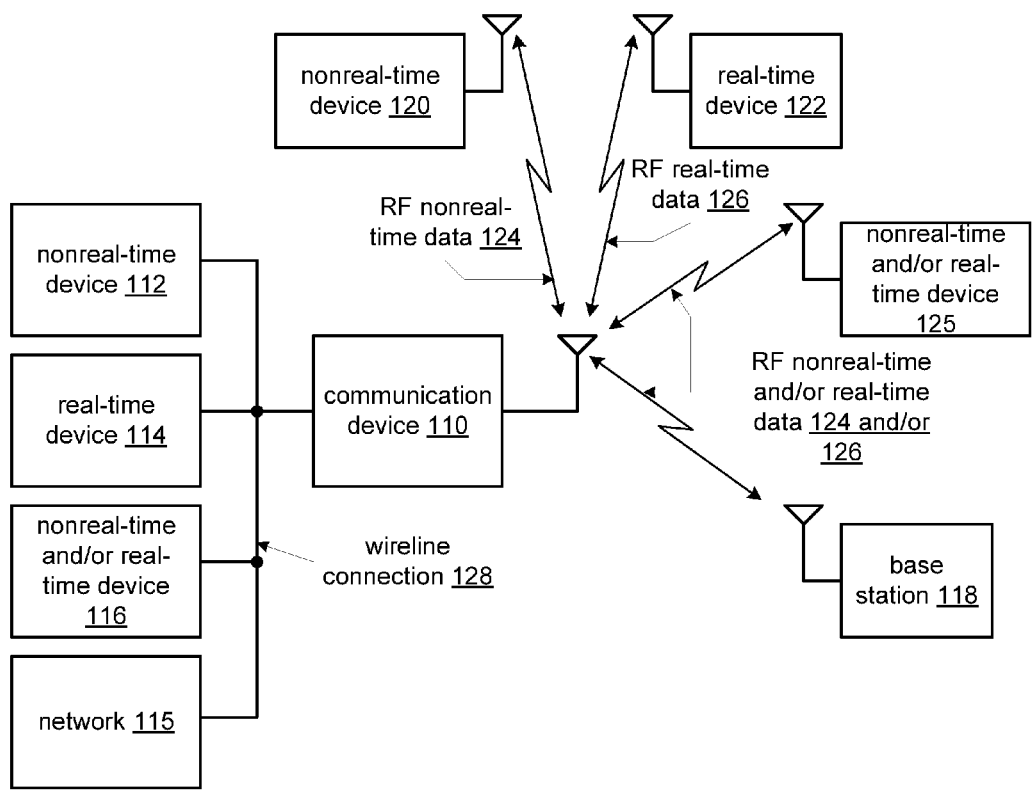
FIG. 1 is a schematic block diagram of an embodiment of a wireless communication system.

FIG. 1 is a schematic block diagram of a communication system in accordance with the technology described herein.

In particular, a communication system is shown that includes a communication device 110 that communicates real-time data 126 and/or non-real-time data 124 wirelessly with one or more other devices such as base station 118, non-real-time device 120, real-time device 122, and non-real-time and/or real-time device 125. In addition, communication device 110 can also optionally communicate over a wireline connection with network 115, non-real-time device 112, real-time device 114, and non-real-time and/or real-time device 116.

In an embodiment of the present invention the wireline connection 128 can be a wired connection that operates in accordance with one or more standard protocols, such as a universal serial bus (USB), Institute of Electrical and Electronics Engineers (IEEE) 488, IEEE 1394 (Firewire), Ethernet, small computer system interface (SCSI), serial or parallel advanced technology attachment (SATA or PATA), or other wired communication protocol, either standard or proprietary. The wireless connection can communicate in accordance with a wireless network protocol such as WiHD, NGMS, IEEE 802.11a, ac, b, g, n, or other 802.11 standard protocol, Bluetooth, Ultra-Wideband (UWB), WIMAX, or other wireless network protocol, a wireless telephony data/voice protocol such as Global System for Mobile Communications (GSM), General Packet Radio Service (GPRS), Enhanced Data Rates for Global Evolution (EDGE), Personal Communication Services (PCS), or other mobile wireless protocol or other wireless communication protocol, either standard or proprietary. Further, the wireless communication path can include separate transmit and receive paths that use separate carrier frequencies and/or separate frequency channels. Alternatively, a single frequency or frequency channel can be used to bi-directionally communicate data to and from the communication device 110.

Communication device 110 can be a mobile phone such as a cellular telephone, a local area network device, personal area network device or other wireless network device, a personal digital assistant, game console, personal computer, laptop computer, or other device that performs one or more functions that include communication of voice and/or data via wireline connection 128 and/or the wireless communication path. Further communication device 110 can be an access point, base station or other network access device that is coupled to a network 115 such at the Internet or other wide area network, either public or private, via wireline connection 128. In an embodiment of the present invention, the real-time and non-real-time devices 112, 114 116, 118, 120, 122 and 125 can be personal computers, laptops, PDAs, mobile phones, such as cellular telephones, devices equipped with wireless local area network or Bluetooth transceivers, FM tuners, TV tuners, digital cameras, digital camcorders, or other devices that either produce, process or use audio, video signals or other data or communications.

In operation, the communication device includes one or more applications that include voice communications such as standard telephony applications, voice-over-Internet Protocol (VoIP) applications, local gaming, Internet gaming, email, instant messaging, multimedia messaging, web browsing, audio/video recording, audio/video playback, audio/video downloading, playing of streaming audio/video, office applications such as databases, spreadsheets, word processing, presentation creation and processing and other voice and data applications. In conjunction with these applications, the real-time data 126 includes voice, audio, video and multimedia applications including Internet gaming, etc. The non-real-time data 124 includes text messaging, email, web browsing, file uploading and downloading, etc.

In an embodiment of the present invention, the communication device 110 includes a wireless transceiver that includes one or more features or functions of the present invention. Such wireless transceivers shall be described in greater detail in association with FIGS. 5-10 that follow.

Figure 2:
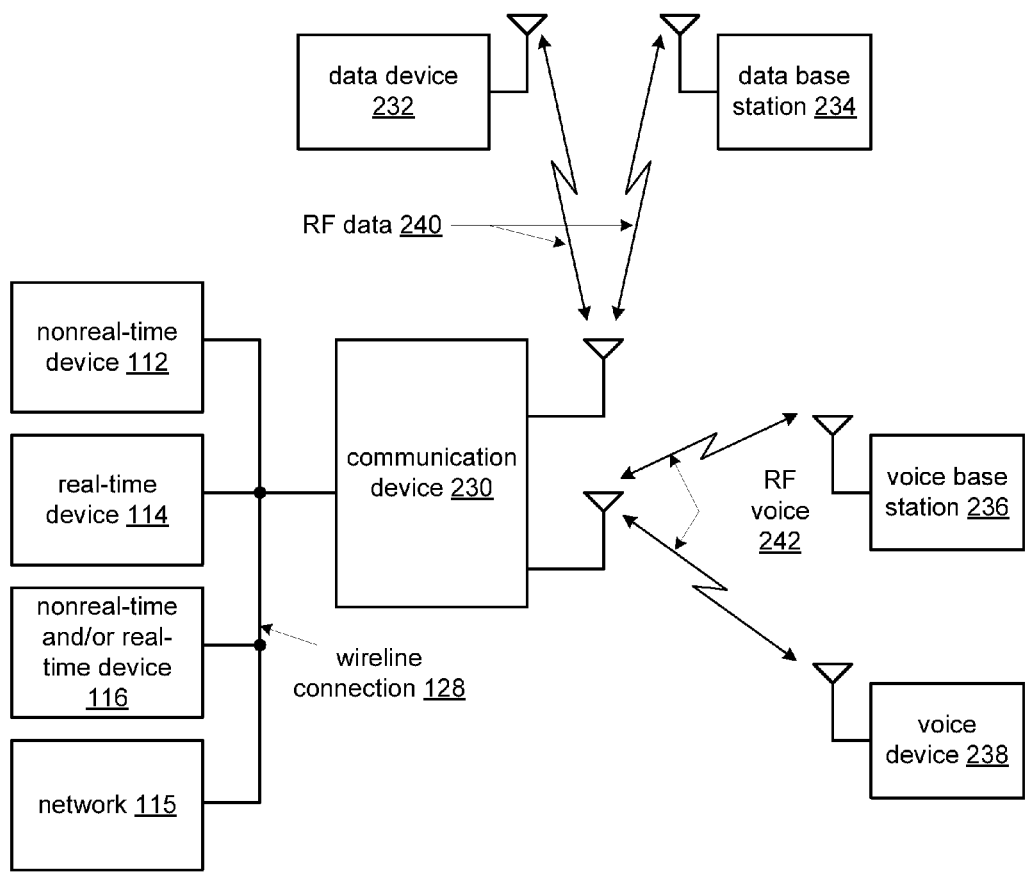
FIG. 2 is a schematic block diagram of another embodiment of a wireless communication system.

FIG. 2 is a schematic block diagram of an embodiment of another communication system in accordance with the present invention. In particular, FIG. 2 presents a communication system that includes many common elements of FIG. 1 that are referred to by common reference numerals. Communication device 230 is similar to communication device 110 and is capable of any of the applications, functions and features attributed to communication device 110, as discussed in conjunction with FIG. 1. However, communication device 230 includes two or more separate wireless transceivers for communicating, contemporaneously, via two or more wireless communication protocols with data device 232 and/or data base station 234 via RF data 240 and voice base station 236 and/or voice device 238 via RF voice signals 242.

Figure 3:
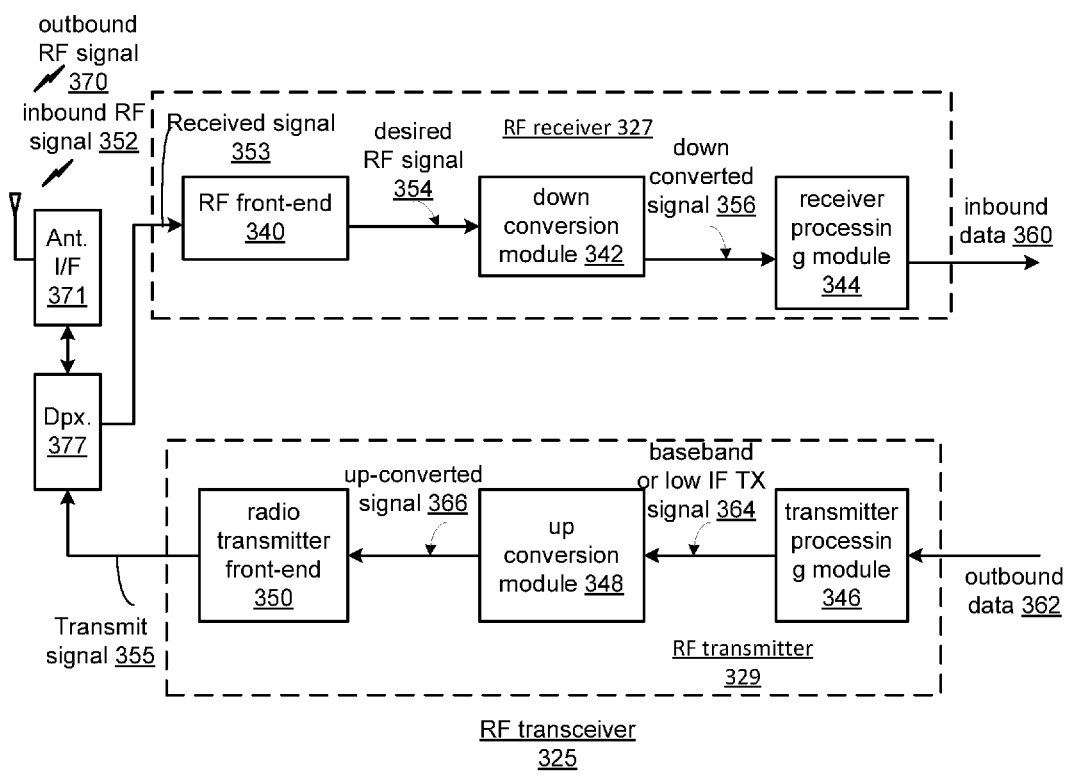
FIG. 3 is a schematic block diagram of an RF transceiver for a wireless communication system.

FIG. 3 is a schematic block diagram of an embodiment of a wireless transceiver 325 in accordance with the present invention. The RF transceiver 325 represents a wireless transceiver for use in conjunction with communication devices 110 or 230, base station 118, non-real-time device 120, real-time device 122, and non-real-time, real-time device 125, data device 232 and/or data base station 234, and voice base station 236 and/or voice device 238. RF transceiver 325 includes an RF transmitter 329, and an RF receiver 327. The RF receiver 327 includes a RF front end 340, a down conversion module 342 and a receiver processing module 344. The RF transmitter 329 includes a transmitter processing module 346, an up conversion module 348, and a radio transmitter front-end 350.

Figure 4:
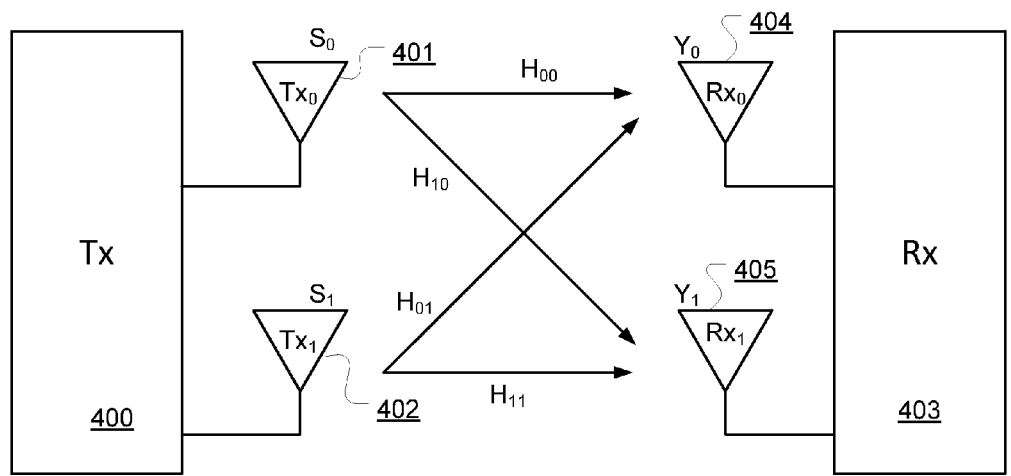
FIG. 4 is a schematic block diagram of a simple two antenna MIMO structure.

As shown, the receiver and transmitter are each coupled to an antenna through an antenna interface 371 and a diplexer (duplexer) 377, that couples the transmit signal 355 to the antenna to produce outbound RF signal 370 and couples inbound signal 352 to produce received signal 353. Alternatively, a transmit/receive switch can be used in place of diplexer 377. While a single antenna is represented in FIG. 3, the receiver and transmitter may share a multiple antenna structure that includes two or more antennas as shown in FIG. 4, discussed in greater detail hereafter.

In operation, the RF transmitter 329 receives outbound data 362. The transmitter processing module 346 packetizes outbound data 362 in accordance with a millimeter wave protocol or wireless telephony protocol, either standard or proprietary, to produce baseband or low intermediate frequency (IF) transmit (TX) signals 364 that includes an outbound symbol stream that contains outbound data 362. The baseband or low IF TX signals 364 may be digital baseband signals (e.g., have a zero IF) or digital low IF signals, where the low IF typically will be in a frequency range of one hundred kilohertz to a few megahertz. Note that the processing performed by the transmitter processing module 346 can include, but is not limited to, scrambling, encoding, puncturing, mapping, modulation, and/or digital baseband to IF conversion.

The up conversion module 348 includes a digital-to-analog conversion (DAC) module, a filtering and/or gain module, and a mixing section. The DAC module converts the baseband or low IF TX signals 364 from the digital domain to the analog domain. The filtering and/or gain module filters and/or adjusts the gain of the analog signals prior to providing it to the mixing section. The mixing section converts the analog baseband or low IF signals into up-converted signals 366 based on a transmitter local oscillation.

The radio transmitter front end 350 includes a power amplifier and may also include a transmit filter module. The power amplifier amplifies the up-converted signals 366 to produce outbound RF signals 370, which may be filtered by the transmitter filter module, if included. The antenna structure transmits the outbound RF signals 370 via an antenna interface 371 coupled to an antenna that provides impedance matching and optional band pass filtration.

The RF receiver 327 receives inbound RF signals 352 via the antenna and antenna interface 371 that operates to process the inbound RF signal 352 into received signal 353 for the receiver front-end 340. In general, antenna interface 371 provides impedance matching of antenna to the RF front-end 340, optional band pass filtration of the inbound RF signal 352.

The down conversion module 342 includes a mixing section, an analog to digital conversion (ADC) module, and may also include a filtering and/or gain module. The mixing section converts the desired RF signal 354 into a down converted signal 356 that is based on a receiver local oscillation, such as an analog baseband or low IF signal. The ADC module converts the analog baseband or low IF signal into a digital baseband or low IF signal. The filtering and/or gain module high pass and/or low pass filters the digital baseband or low IF signal to produce a baseband or low IF signal 356 that includes an inbound symbol stream. Note that the ordering of the ADC module and filtering and/or gain module may be switched, such that the filtering and/or gain module is an analog module.

The receiver processing module 344 processes the baseband or low IF signal 356 in accordance with a millimeter wave protocol, either standard or proprietary, to produce inbound data 360 such as probe data received from a probe device or devices (not shown). The processing performed by the receiver processing module 344 can include, but is not limited to, digital intermediate frequency to baseband conversion, demodulation, demapping, depuncturing, decoding, and/or descrambling.

In an embodiment of the present invention, receiver processing module 344 and transmitter processing module 346 can be implemented via use of a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The associated memory may be a single memory device or a plurality of memory devices that are either on-chip or off-chip. Such a memory device may be a read-only memory, random access memory, volatile memory, non-volatile memory, static memory, dynamic memory, flash memory, and/or any device that stores digital information. Note that when the processing devices implement one or more of their functions via a state machine, analog circuitry, digital circuitry, and/or logic circuitry, the associated memory storing the corresponding operational instructions for this circuitry is embedded with the circuitry comprising the state machine, analog circuitry, digital circuitry, and/or logic circuitry.

While the processing module 344 and transmitter processing module 346 are shown separately, it should be understood that these elements could be implemented separately, together through the operation of one or more shared processing devices or in combination of separate and shared processing.

In another embodiment, the receiver and transmitter may share a multiple input multiple output (MIMO) antenna structure, diversity antenna structure, phased array or other controllable antenna structure that includes a plurality of antennas and other RF transceivers similar to RF transceiver 325. Each of these antennas may be fixed, programmable, an antenna array or other antenna configuration. Also, the antenna structure of the wireless transceiver may depend on the particular standard(s) to which the wireless transceiver is compliant and the applications thereof.

FIG. 4 illustrates a simple two antenna MIMO structure. A transmitting (Tx) unit 400 is shown having two antennas 401, 402, while a receiving (Rx) unit 403 is shown having two antennas 404, 405. It is to be noted that both transmitting unit 400 and receiving unit 403 are generally both transceivers, but are shown as separate Tx and Rx units for an exemplary purpose in FIG. 4. That is, Tx unit 400 is transmitting data and Rx unit 403 is receiving the transmitted data. The transmitted data symbols at antennas 401 ($Tx_0$), 402 ($Tx_1$) are noted as $S_0$ and $S_1$, respectively. The received data symbols at antennas 404 ($Rx_0$), 405 ($Rx_1$) are noted as $Y_0$ and $Y_1$ respectively. Since the example illustrates a two transmit antenna/two receive antenna MIMO system, the four resulting RF signal paths are noted as $H_{00}$, $H_{01}$, $H1_{10}$, and $H_{11}$ (using the $H_{Tx\text{-}Rx}$ notation) and the data path is referred to as channel H. While, the example illustrated is a two antenna structure, the embodiments disclosed herein may operate within other known antenna configurations (e.g., 2×4, 2×8, 4×16, etc.)

Further details including optional functions and features of the RF transceiver are discussed in conjunction with FIGS. 5-8 that follow.

In telecommunications, the terms multi-band, dual-band, tri-band, quad-band and penta-band refer to a device (especially a mobile phone) supporting multiple radio frequency bands (communication signal bands). All devices which have more than one channel use multiple frequencies; a band however is a typically a group of frequencies containing many channels. Multiple bands in mobile devices support roaming between different regions where different standards are used for mobile telephone services. Where the bands are widely separated in frequency (e.g., >>20 MHz), parallel transmit and receive signal path circuits must be provided, which increases the cost, complexity and power demand of multi-band devices.

In traditional multi-band transmitters (e.g., 11g and 11a WLAN Txs), each band has its own up-convertor mixer. A mixer or frequency mixer is a nonlinear electrical circuit that creates new frequencies from two signals applied to it. In its most common application, two signals at frequencies f1 and f2 are applied to a mixer, and it produces new signals typically used to shift signals from one frequency range to another. Frequency mixers are also used to modulate a carrier frequency in radio transmitters.

Circuit complexity, size and corresponding chip real estate are components which, when minimized, help reduce costs, reduce power requirements and increase chip densities.

Figure 5:
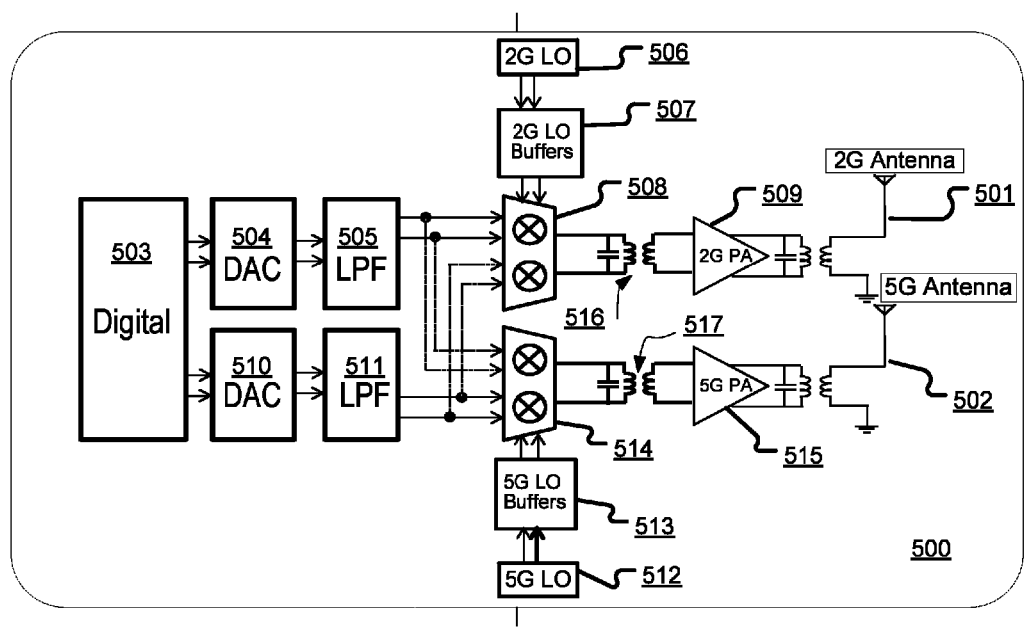
FIG. 5 shows an embodiment of a multi-band transmitter employing two separate mixers and corresponding LO buffers for each band.

FIG. 5 shows an example embodiment of a multi-band transmitter employing two separate mixers and corresponding LO buffers for each band. In this example, multi-band transmitter 500 includes dual transmission bands centered around 2 GHz and 5 GHz transmitted from antennas 501 and 502, respectively. The transmission bands are typically around 40+ MHz wide. However, the number of bands, frequencies selected and band width ranges can be modified without departing from the scope of the presently described embodiments.

As shown, digital processing input stage(s) 503 produces distinct processing chains to process output distinct digital communication signals (bands). The two processing chains each include a digital-to-analog converter (DAC) 504 and 510

(respectively) producing two analog bands which are low-pass filtered (LPF) by filters 505 and 511. The filtered signals are passed to mixers 508 and 514 which include inputs from local oscillators (LO) 506(2G) and 512(5G) through corresponding LO buffers 507 and 513. The mixers are used to up-convert their respective input communication bands into the desired RF bands, in this example 2 GHz and 5 GHz (respectively). Up-converted RF band signals are passed to tuning stages 516 and 517 and amplification stages (power amplifiers (PA) 509 and 515) and to their respective transmission antennas 501 and 502. In this typical arrangement, the active area of the mixers and buffers takes up significant chip real estate. What is needed is an arrangement which can reduce this requirement (e.g., 50% or less) while still providing the necessary functionality.

Figure 6:
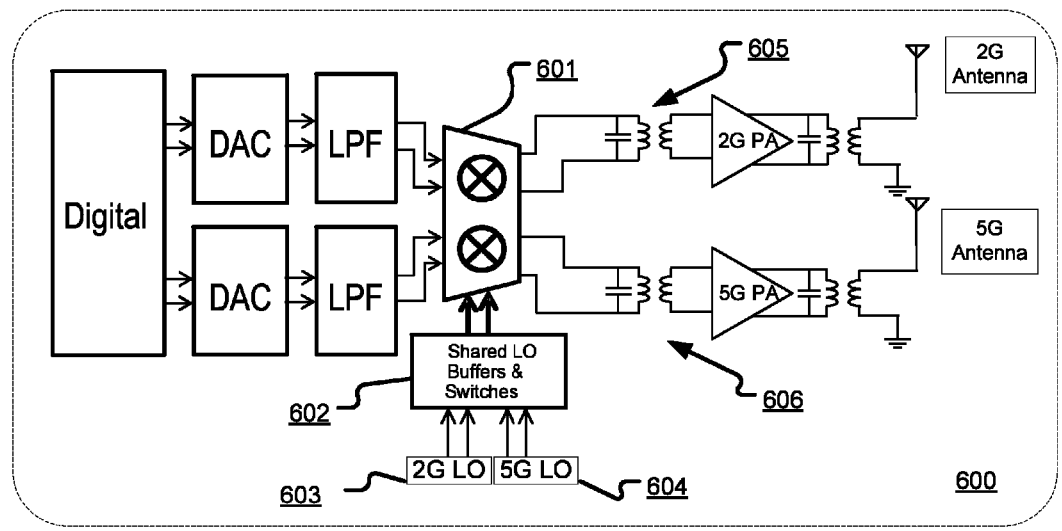
FIG. 6 illustrates one embodiment using a single shared mixer for multiple bands.

FIG. 6 illustrates one embodiment of the technology described herein which comprises suitable hardware/software 600 in the form of circuitry, logic gates, and/or code that functions to use a single mixer 601 for both bands (but not simultaneously) to reduce the required chip area. In this embodiment, switches are used in LO path 602 which includes local frequency specific oscillators LO 603 and 604 for sample bands 2G and 5G, respectively. The switches provide a desired RF frequency specific signal to the mixer core for proper up-conversion to the desired RF band. For each band, multiple inductors 605 and 606, respectively, are used at the load to tune the output for each band separately. Power amplifiers, in this example, 2G PA and 5G PA, amplify the tuned RF signal bands for transmission from associated antennas (2G Antenna and 5G Antenna). The PA that is not used, for example 2G PA while transmitting through 5G antenna, is turned OFF by use of proper switches placed inside the PA.

Figure 7:
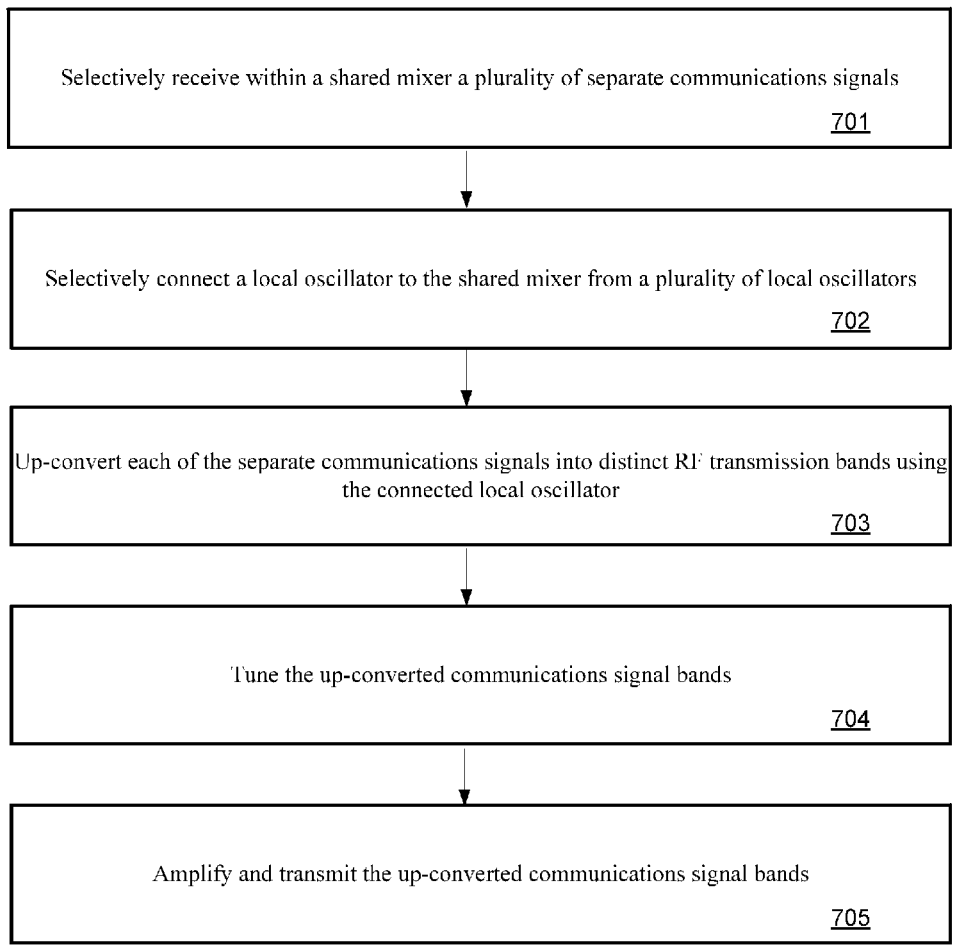
FIG. 7 illustrates one embodiment flow diagram using a shared mixer for multiple bands.

FIG. 7 illustrates one embodiment method using a shared mixer for multiple bands. As shown in step 701, a plurality of separate communications signals (e.g., widely separated bands) are selectively (e.g., sequentially or alternatively) fed to the shared mixer. For each distinct band, an RF output from the transmitter (i.e., from associated transmit antennas) settles in at a desired target transmission center frequency. In order to achieve these desired target transmission frequency bands, in step 702, an appropriate local oscillator (LO) is selectively connected to the shared mixer. As an example, a 2 GHz local oscillator would be connected to the shared mixer to achieve a distinct transmission band (e.g., 40 MHz) centered around 2 GHz. In step 703, the distinct band input to the shared mixer is up-converted to the desired target output transmission band using the connected LO. After up-conversion, in step 704, the output signal bands are separately tuned at the load. In step, 705, the tuned bands are separately amplified using power amplifiers and antennas located within their respective transmission output chain.

Figure 8:
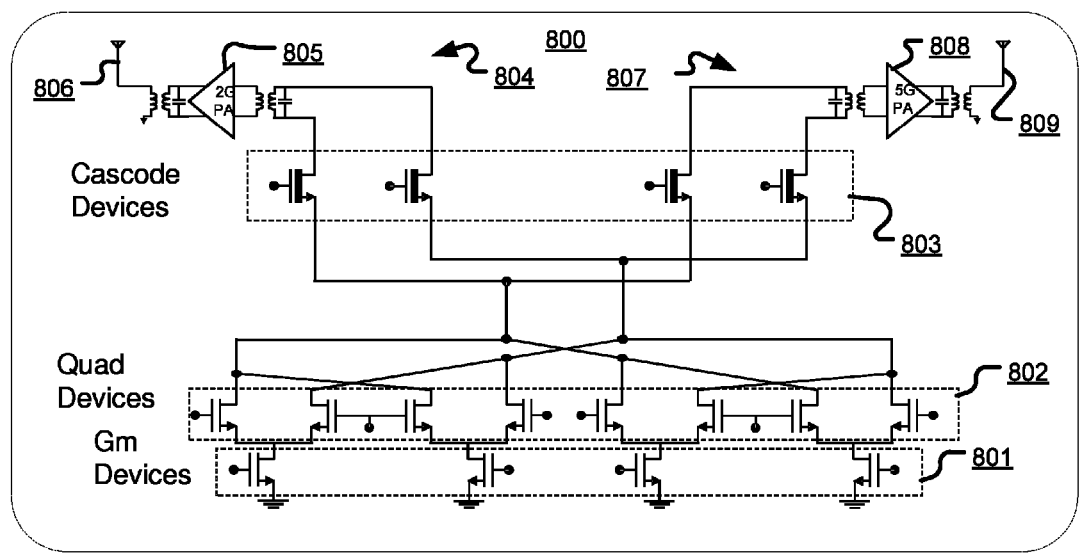
FIG. 8 illustrates one embodiment circuitry to implement a shared mixer as shown and described in accordance with FIGS. 6 and 7.

FIG. 8 illustrates one embodiment of the technology described herein which comprises suitable CMOS circuitry 800 to implement a shared mixer as shown and described in accordance with FIGS. 6 and 7. As shown, a multi-band up-converter mixer core includes, but is not limited to, fully shared Gm (transconductance) stage 801, shared mixing stage 802, and cascode stage 803. In stage 801, a plurality of transistor (e.g., CMOS) pairs form a shared Gm stage where each of the transistor pairs receives a distinct communications signal (e.g., one of two distinct widely separated bands) as an input. In stage 802, a plurality of quad transistor stages (in this example, two cross connected quad stages) are operatively connected to the shared Gm stage and form a shared mixing stage where each of the plurality of quad transistor stages receives a distinct local oscillator (LO) signal to up-convert a distinct communications signal received from the shared Gm stage. Stage 803 includes transistor pairs forming a cascode output stage operatively connected to the shared mixing stage where each of the transistor pairs receives a distinct up-converted communications signal (e.g., desired target RF band) as an input and selectively passes the up-converted communications signal to an associated output transmission stage (in this example 2 GHz stage 804 and 5 GHz stage 807.

Separate from the shared mixing core, FIG. 8 also shows example 2 GHz output transmission stage 804 including a tuning stage (e.g., LC) at the load, a power amplifier 805, and output transmitter antenna 806. Also shown is a separate output transmission stage 807, for example a 5 GHz stage, including a similar tuning stage (e.g., LC) at the load, a power amplifier 808, and output transmitter antenna 809.

Cascode transistors 803 in the mixer are also used to isolate the loading of the following stage of each band on the other band. These cascode transistors can be used as part of the gain control as well.

Fully shared quad devices enable use of shared LO buffers to save additional chip area. As stated supra, cascode devices of one band can be used for gain control of the other band. No additional devices are needed for gain control. And finally, the cascode devices isolate loading of each band on the other band.

Figure 9:
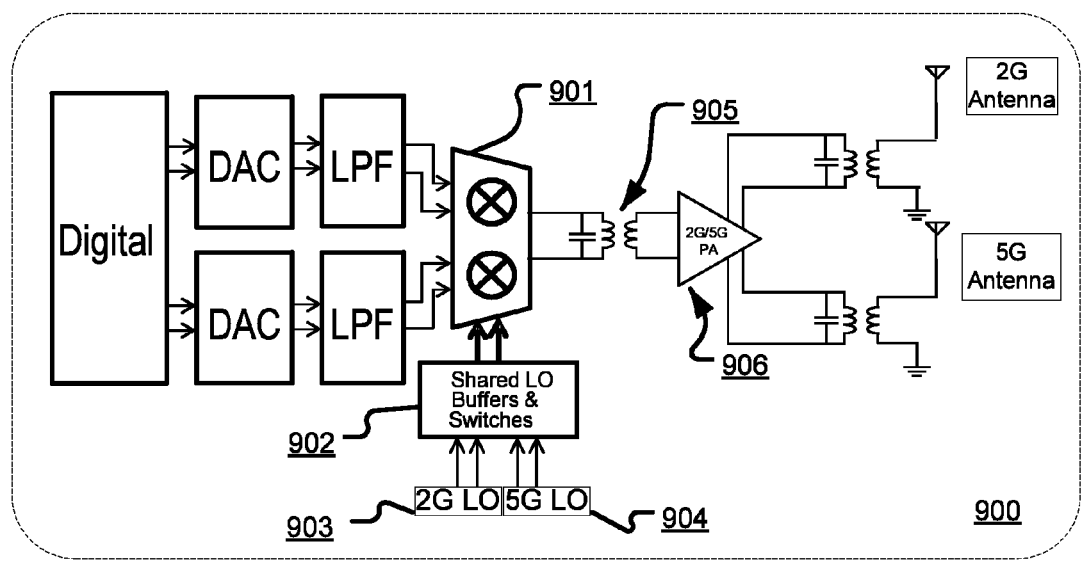
FIG. 9 illustrates one embodiment using a single shared mixer, a shared mixer tuning block and a shared PA for multiple bands.

FIG. 9 illustrates another embodiment of the circuit shown in FIG. 6, in which not only the mixer is shared between two bands, but also the mixer tuning block and the PAs are shared. The operation of the mixer is same as in FIG. 6. The tuning block 905 can be implemented via use of switched capacitors, switched inductors, double-tuned circuitry or a combination of these three techniques, to tune the mixer load depending on the band of operation.

Figure 10:
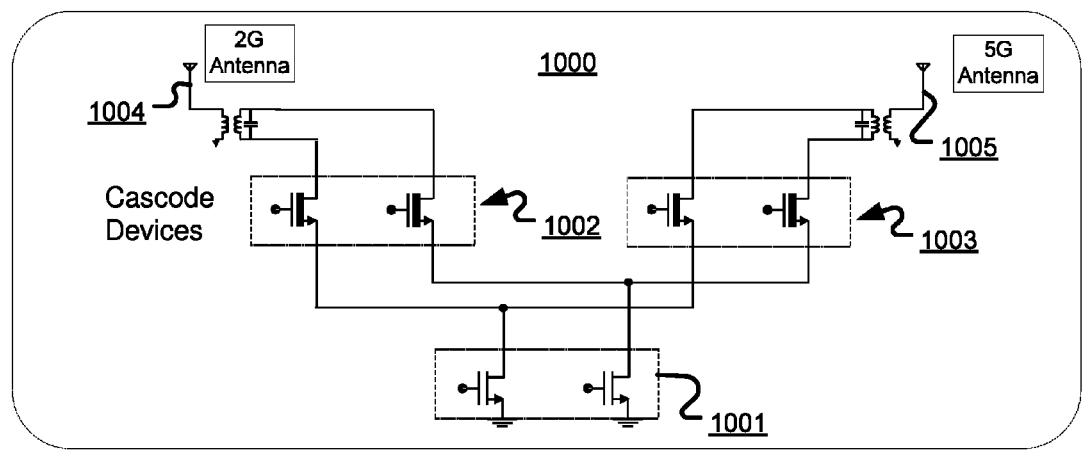
FIG. 10 illustrates one embodiment circuitry to implement a shared mixer, a shared mixer tuning block and a shared PA in accordance with FIG. 9.

FIG. 10 shows one embodiment circuit to implement the shared 2G & 5G PA block 906 previously shown in FIG. 9. Input gm devices 1001 are shared for both 2G and 5G bands. In 2G mode, the gate bias of the 2G cascode devices 1002 which are connected to 2G antenna 1004 are biased at the proper value such that the gm 1001 output signal reaches to the 2G antenna whereas the gate bias of the 5G cascode devices 1003 are biased at a different proper value, for example 0V, such that the gm output signal does not reach the 5G antenna. In 5G mode, the gate bias of the 2G and 5G can be swapped accordingly.

The various embodiments described herein can be fully implemented in, but not limited to, a RF transceiver, user equipment transceiver, base station transceiver, wireless transceiver, LTE transceiver or MIMO transceiver.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operatively connected", "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship.

As may also be used herein, the terms "processing module", "processing circuit", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The technology as described herein has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The technology as described herein may have also been described, at least in part, in terms of one or more embodiments. An embodiment of the technology as described herein is used herein to illustrate an aspect thereof, a feature thereof, a concept thereof, and/or an example thereof. A physical embodiment of an apparatus, an article of manufacture, a machine, and/or of a process that embodies the technology described herein may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as CMOS, as one of ordinary skill in the art will appreciate, the transistors may be implemented using any type of transistor structure including, but not limited to, bipolar, field effect (FET) or metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

While particular combinations of various functions and features of the technology as described herein have been expressly described herein, other combinations of these features and functions are likewise possible. The technology as described herein is not limited by the particular examples disclosed herein and expressly incorporates these other combinations.

The invention claimed is:

1. A transmitter for a communications transceiver comprising:
   a digital processing input stage providing communication signals to at least two distinct processing chains, each one of the at least two distinct processing chains processing separate communications signals;
   a shared mixer connected to the at least two distinct processing chains;
   circuitry to selectively receive and process within the shared mixer each of the separate communications signals, and an output stage to individually transmit each of the processed separate communications signals.

2. The transmitter for a communications transceiver, as per claim 1, comprising a digital-to-analog converter followed by a low-pass filter operative within each of the at least two distinct processing chains, the digital-to-analog converters and low-pass filters converting and filtering corresponding separate communications signals.

3. The transmitter for a communications transceiver, as per claim 1, further comprising a plurality of local oscillators as inputs to the shared mixer.

4. The transmitter for a communications transceiver, as per claim 3, wherein the circuitry includes at least switches to selectively connect each of the plurality of local oscillators to up-convert, within the shared mixer, each of the separate communication signals.

5. The transmitter for a communications transceiver, as per claim 4, wherein the output stage further comprises a plurality of tuners, each of the plurality of tuners separately tuning corresponding up-converted separate communication signals.

6. The transmitter for a communications transceiver, as per claim 5, wherein the output stage further comprises a plurality of power amplifiers and associated antennas, each of the plurality of power amplifiers amplifying an output of each of corresponding tuned separate communication signals and each of the plurality of antennas transmitting an output of each of corresponding amplified communication signals.

7. The transmitter for a communications transceiver, as per claim 4, wherein the output stage further comprises a shared tuner, the shared tuner selectively tuning up-converted separate communication signals.

8. The transmitter for a communications transceiver, as per claim 7, wherein the output stage further comprises a shared power amplifier and a plurality of transmission antennas, the shared power amplifier selectively amplifying an output of each the tuned separate communication signals and each of the plurality of antennas transmitting an output of each of corresponding amplified communication signals.

9. The transmitter for a communications transceiver, as per claim 1, wherein the shared mixer requires 50% or less active chip area than a multi-mixer configuration.

10. The transmitter for a communications transceiver, as per claim 1, wherein the transmitter is operative in any of: an RF transceiver, user equipment transceiver, base station transceiver, wireless transceiver, LTE transceiver or MIMO transceiver.

11. A method for multi-band up-conversion in a transmitter, the method comprising:
   selectively receiving and processing within a shared mixer a plurality of separate communications signals, the processing comprising:
      selectively connecting a local oscillator from a plurality of local oscillators, the selectively connected local oscillator selected to match a distinct transmission signal band center frequency for each selectively received separate communications signal;
      selectively up-converting each of the separately received communications signals into distinct transmission communication signal bands using the selectively connected local oscillator; and
      tuning of each of the distinct transmission communication signal bands.

12. The method for multi-band up-conversion in a transmitter, as per claim 11, wherein the tuning further comprises separate or shared tuning of each of the distinct transmission communication signal bands.

13. The method for multi-band up-conversion in a transmitter, as per claim 12, further comprising the steps of separate or shared amplification and transmission of each of the tuned distinct transmission communication signal bands.

14. The method for multi-band up-conversion in a transmitter, as per claim 12, wherein the multi-band up-conversion steps are operative in any of: an RF transceiver, user equipment transceiver, base station transceiver, wireless transceiver, LTE transceiver or MIMO transceiver.

15. A multi-band up-conversion mixer circuit comprising:
   a first plurality of transistor pairs forming a shared Gm stage, each of the transistor pairs receiving a distinct communications signal as an input;
   a plurality of quad transistor stages connected to the shared Gm stage and forming a shared mixing stage, each of the plurality of quad transistor stages receiving a distinct local oscillator signal to up-convert the distinct communications signal received from the shared Gm stage, and
   a second plurality of transistor pairs forming a cascode output stage connected to the shared mixing stage, each of the second transistor pairs receiving the distinct up-converted communications signal as an input and selectively passing the distinct up-converted communications signal to an associated transmission stage.

16. The multi-band up-conversion mixer circuit, as per claim 15, wherein the distinct communication signals comprise distinct communication bands and the distinct up-converted communications signals comprise distinct up-converted RF communication bands.

17. The multi-band up-conversion mixer circuit, as per claim 15, wherein the second plurality of transistor pairs forming the cascode output stage used to pass a first distinct up-converted band are used for gain control of a second distinct up-converted communication band.

18. The multi-band up-conversion mixer circuit, as per claim 15, wherein the plurality of second transistor pairs forming the cascode output stage are used to isolate loading of a first distinct up-converted band from a second distinct up-converted communication band.

19. The multi-band up-conversion mixer circuit, as per claim 15, wherein the plurality of quad transistor stages further comprise fully shared LO buffers.

20. The multi-band up-conversion mixer circuit, as per claim 15, wherein the multi-band up-conversion mixer circuit is operative in any of: an RF transceiver, user equipment transceiver, base station transceiver, wireless transceiver, LTE transceiver or MIMO transceiver.

\* \* \* \* \*